United States Patent
Von Thun

(10) Patent No.: US 7,733,146 B2
(45) Date of Patent: Jun. 8, 2010

(54) SET AND SEGR RESISTANT DELAY CELL AND DELAY LINE FOR POWER-ON RESET CIRCUIT APPLICATIONS

(75) Inventor: Matthew Von Thun, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 11/347,903

(22) Filed: Feb. 6, 2006

(65) Prior Publication Data

US 2007/0182474 A1     Aug. 9, 2007

(51) Int. Cl.
    *H03H 11/26*  (2006.01)
(52) U.S. Cl. ........................ 327/261; 327/100
(58) Field of Classification Search ......... 327/261–290, 327/100, 141, 231, 336, 392, 205, 206, 143; 307/126; 326/81
    See application file for complete search history.

(56) References Cited

U.S. PATENT DOCUMENTS

| | | | |
|---|---|---|---|
| 5,672,918 A * | 9/1997 | Kimbrough et al. ......... 307/126 |
| 6,084,446 A * | 7/2000 | Chen et al. ................... 327/143 |
| 6,476,638 B1 * | 11/2002 | Zhou et al. ..................... 326/81 |
| 6,661,271 B1 * | 12/2003 | Burdick et al. ............... 327/269 |
| 6,914,467 B2 * | 7/2005 | Feng et al. ................... 327/261 |
| 7,233,182 B1 * | 6/2007 | Savoj ......................... 327/141 |
| 2005/0077943 A1 * | 4/2005 | Kakuda et al. ............... 327/277 |

* cited by examiner

*Primary Examiner*—Lincoln Donovan
*Assistant Examiner*—Diana J Cheng
(74) *Attorney, Agent, or Firm*—William J. Kubida; Scott J. Hawranek; Hogan & Hartson LLP

(57) ABSTRACT

A delay line appropriate for use in a POR circuit or other integrated circuit in a space environment combines three separate circuit techniques to improve performance without unnecessarily increasing circuit area or adding to manufacturing costs when compared to a simple inverter delay line. The delay line of the present invention uses the selective placement of capacitors throughout the delay line, one-sided current starving, and the incorporation of one-sided Schmitt trigger circuits. Performance of the delay line is substantially immune to SEGR events ("Single Event Gate Rupture") and SET events ("Single Event Transients"). Spurious signals produced by SEGR and SET events are quickly and substantially attenuated.

26 Claims, 3 Drawing Sheets

SET AND SEGR RESISTANT DELAY CELL AND DELAY LINE FOR POWER-ON RESET CIRCUIT APPLICATIONS

BACKGROUND OF THE INVENTION

It is known in the art that a delay cell can simply be constructed of a single inverter and a capacitive delay element. Similarly, an entire delay line can be constructed of a chain of inverter delay cells, wherein the output of an inverter delay cell is coupled to the output of the next inverter delay cell. Delay lines are widely used in a great number of integrated circuit applications. They are used, for example, in POR ("Power On Reset") circuits.

While an inverter delay line can be simply designed and manufactured, and is a cost effective solution for a wide number of applications, such a solution may not be optimum for circuits used in a space environment. A space environment is subject to radiation not found in terrestrial applications that can damage circuits and affect performance. Using a standard inverter delay line circuit in a space environment is not advised because it would be subject to SEGR events ("Single Event Gate Rupture") and SET events ("Single Event Transients") if struck with a heavy ion. If the inverter delay line were incorporated into a POR circuit, for example, a SET event could cause the POR circuit to send out a spurious reset signal, which would disrupt the performance of the integrated circuit into which the POR circuit was incorporated. Similarly, a SEGR event could also send out a spurious reset signal, but, in addition, could fatally damage the POR circuit and cause the entire integrated circuit into which the POR circuit was incorporated to become permanently inoperable.

What is desired, therefore, is delay line circuit that is appropriate for use in a POR circuit in a space environment, but is realized with a design that can still be economically implemented in an integrated circuit.

SUMMARY OF THE INVENTION

According to the present invention, a delay line appropriate for use in a POR circuit or other integrated circuits in a space environment combines three separate circuit techniques to improve performance without unnecessarily increasing circuit area or adding to manufacturing costs when compared to a simple inverter delay line. The delay line of the present invention uses the selective placement of capacitors throughout the delay line, one-sided current starving, and the incorporation of one-sided Schmitt trigger circuits.

The actual delay element, a capacitor, is placed only on odd stages of the delay line, and the capacitors are completely discharged during normal operation. This substantially eliminates the threat of a SEGR related event damaging the part or producing a spurious reset signal. This is because the energy a heavy ion requires to cause a rupture is inversely proportional to the square of the voltage across the capacitor. With a voltage at or near zero volts, the required ion energy for rupture is beyond that found in any known space environment.

Since the delay element, the capacitor, is current starved from only one side, transient pulses are substantially eliminated after every even stage in the delay chain, preventing SET event disruption. Transient pulses are reduced due to the asymmetrical use of current starving in the delay chain.

The reduction in the transient pulses provided by the current starving technique is reinforced by the use of "half Schmitt" trigger circuits in the delay line. A typical delay line attenuates the width of a transient pulse about one-half of its width through each even/odd pair of delay stages in the delay chain. Through the use of the half Schmitt trigger circuit in the present invention, a transient pulse is reduced in width when passing through a single even/odd pair of delay stages. Since the response of the next transistor in the delay line of the present invention is weakened due to current starving and heavy load capacitance, a spurious pulse caused by a heavy ion with an LET ("Linear Energy Transfer") of even 100 Mev-cm$^2$/mg are eliminated after only one even/odd chain pair of delay stages.

Using the half Schmitt trigger circuit scheme of the present invention, the capacitors in the odd stages of the delay chain are almost completely discharged before passing along a reset signal, thus making the most efficient use of capacitor area. Additionally, the one-sided current starved configuration of the present invention can be adjusted to provide a very minimal discharge current thus further maximizing the delay available from a given capacitive element.

While the delay line of the present invention is ideal for use in a POR circuit in a space environment, it can be used more generally in any circuit requiring radiation immunity wherein a "one shot" delay element is required. An example is an input stage of a circuit where an enable signal is delayed with respect to another signal in the circuit

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
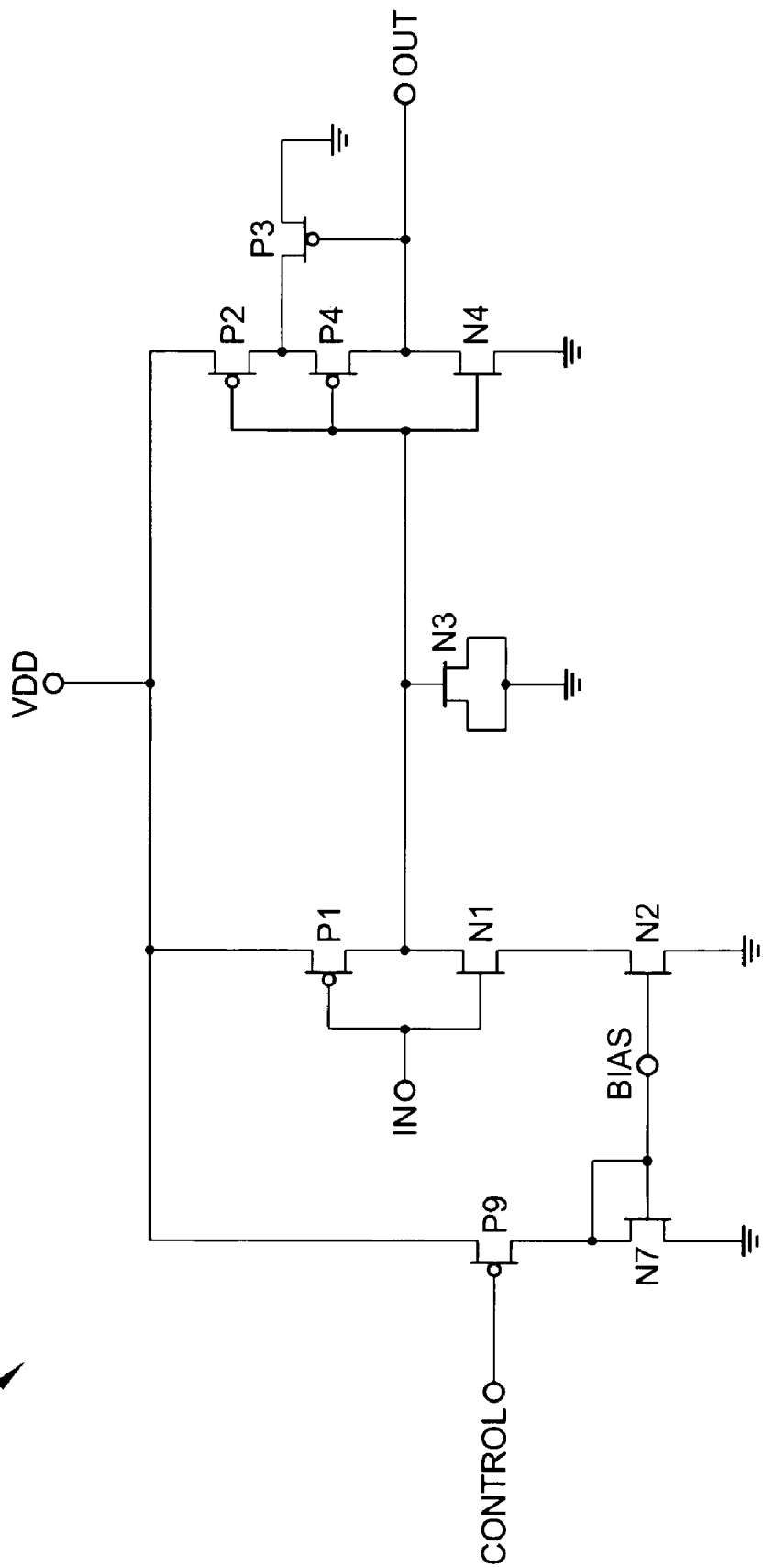
FIG. 1 is a delay cell including an odd delay stage, a capacitive delay element, and an even delay stage.

Referring now to FIG. 1, an SET and SEGR resistant delay cell 10 includes a delay input node marked "IN" and a delay output node marked "OUT". A one-sided current starved inverting input section (odd delay stage) has an input coupled to the delay input, and an output. A capacitor is coupled between the output of the input section and ground. A half-Schmitt trigger circuit (even delay stage) has an input coupled to the output of the input section, and an output coupled to the delay output.

The input section, which is also referred to as an odd delay stage, includes a P-channel transistor P1 having a source coupled to VDD, a gate coupled to the input, and a drain coupled to the output. A first N-channel transistor N1 has a source, a gate coupled to the input, and a drain coupled to the output. A second N-channel transistor N2 has a source coupled to ground, a gate for receiving a bias voltage at a node marked "BIAS", and a drain coupled to the source of the first N-channel transistor N1.

The bias voltage comprises a diode-generated bias voltage for generating an appropriate gate voltage for transistor N2. The bias voltage can be provided by a diode and a resistor or a diode-connected transistor and resistor as is well known in the art. The bias voltage can also be provided by a bias circuit including a P-channel transistor P9 having a source coupled to VDD, a gate for receiving a CONTROL control voltage from a current mirror circuit (reset of P-channel current mirror not shown in FIG. 1), and a drain, as well as a diode-connected N-channel transistor N7 coupled between the drain of the P-channel transistor and ground for providing a controlled bias voltage. Many other biasing circuits are known in the art. Typical currents provided by the drains of transistors P1 and N1 are >500 μA and <100 μA, respectively.

A capacitor-connected N-channel transistor N3 has a gate coupled to the output of the odd delay stage, and a coupled source and drain coupled to ground. Capacitor-connected transistor N3 provides the actual delay element for the entire delay cell 10. The capacitor is discharged during normal operation, and is only charged when a pulse is passing through the delay cell.

The half-Schmitt trigger circuit, or even delay stage, includes a first P-channel transistor P2 having a source coupled to VDD, a gate coupled to the input, and a drain. A second P-channel transistor P4 has a source coupled to the drain of the first P-channel transistor, a gate coupled to the input, and a drain coupled to the output. A third P-channel transistor P3 has a current path coupled between drain of the first P-channel transistor and ground, and a gate coupled to the output. An N-channel transistor N4 has a drain coupled to the output, a gate coupled to the input, and a source coupled to ground.

A Schmitt trigger uses feedback to impose hysteresis (or asymmetry) on the switching point of a signal going through a circuit. A Schmitt trigger is commonly used to prevent noise from inadvertently causing the output of the Schmitt trigger to flip. If the feedback is only applied to the pull-up or the pull-down inside the Schmitt trigger, then only the high input threshold or the low input threshold is offset from a nominal center input threshold. In the half-Schmitt trigger of the present invention, the feedback is applied only to the pull-up inside the Schmitt trigger, thus making it difficult for a falling edge signal to change the state of the output, but making it relatively easier for a rising edge signal to change the state of the output.

Figure 2:
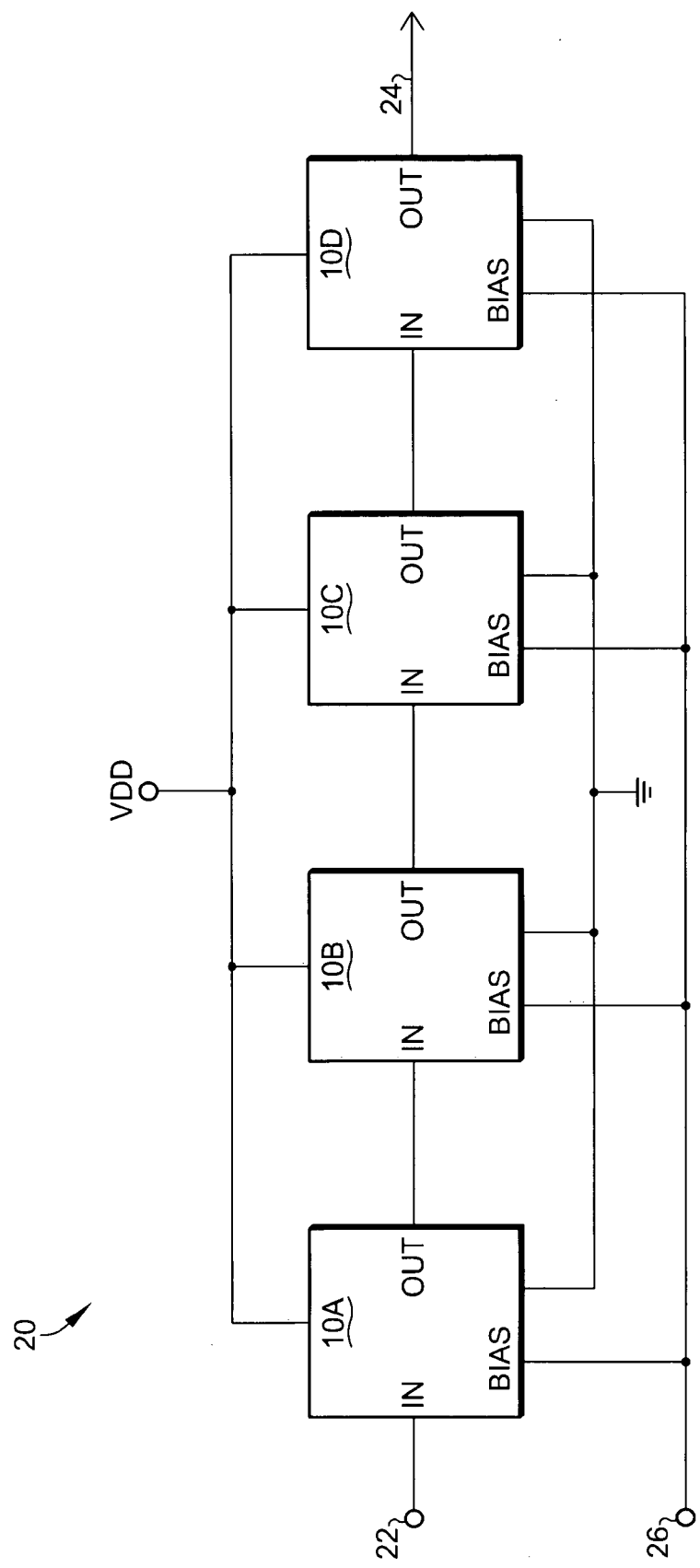
FIG. 2 is a delay line using the delay cells shown in FIG. 1.

A delay line 20 formed of four delay cells 10A through 10D is shown in FIG. 2. The input node for the delay line is node 22, and the output node for the delay line is node 24. All of the VDD power terminals for the delay cells 10A through 10D are coupled together and to VDD. Similarly, all of the ground terminals for the delay cells 10A through 10D are coupled together and to ground. The bias voltage is provided to all of the BIAS inputs of delay cells 10A through 10D at node 26. The output node OUT of a delay cell is coupled to the input node IN of the next delay cell in the delay line 20. For example, the OUT node of delay cell 10B is coupled to the IN node of delay cell 10C. The total delay from node 22 to node 24 in delay line 20 is thus four times the delay provided by a single delay cell. While four delay cells are shown in the delay line 20 of FIG. 2, any number of delay cells can be used.

Figure 3:
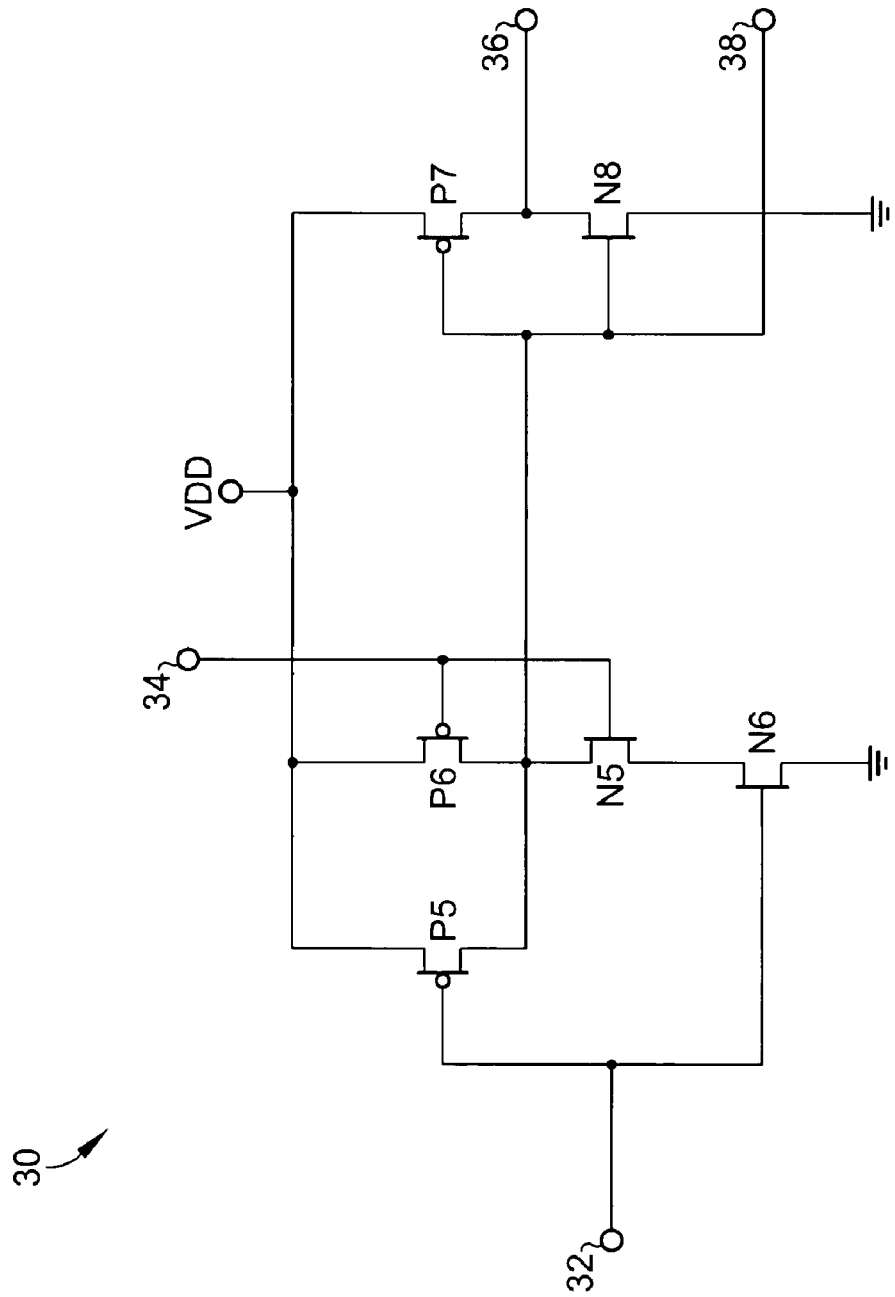
FIG. 3 is an output stage for use in the delay line of FIG. 2.

Referring now to FIG. 3, the delay line 20 can include an optional output section. A simple output section can include a single inverter includes P-channel transistor P7 and N-channel transistor. If desired, a more complicated output section can be included, especially for use in a POR circuit. In FIG. 3, node 34 is a first input for receiving the input signal of the delay line. A second input at node 32 is coupled to the output of the last delay cell in the delay line. A non-inverting output is provided at node 38, and an inverting output is provided at node 36. The gates of P-channel transistor P5 and N-channel transistor N6 are coupled to node 32, and the gates of P-channel transistor P6 and N-channel transistors N5 and N6 are coupled to node 34.

According to the present invention, a POR circuit that includes a delay chain is preferred over a voltage circuit alone because a delay chain allows a slow continuously ramping supply to reach a final steady state value before reusing its POR signal rather than releasing the signal at just the minimum operating voltage. This improves both the performance and reliability of the circuit controlled by the POR signal. Delay chains allow hysteresis in the POR signal so that POR is released when power is greater than 99.9% of final VDD, but will not reset unless power drops below some specified threshold such as 60% of VDD. Delay chains add consistency to a voltage detect circuit. The voltage detect circuit may have a 10% or greater variation across PVT ("process-voltage-temperature"), however with a delay chain; the variation across PVT can be less than 1%.

According to the present invention, four (or more) small delay elements are preferred over one single large delay element because, in the unlikely event that an ion strike hits a capacitor during the initial discharging phase, the delay is only reduced by a maximum of 25%. However, the delay on the large capacitor could be reduced by 100%. A chain of delay elements can be set up to charge in parallel when POR needs to be reset quickly, but set up in series to provide maximum delay before releasing a POR signal during power up. A chain of delay elements can be tapped at intermediate points in order to provide delays of more than one duration.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. An SET and SEGR resistant delay cell configured to be substantially immune to radiation effects, comprising:
   a delay input and a delay output;
   a one-sided current starved input section having an input coupled to the delay input, and an output;
   a capacitor coupled between the output of the input section and ground, wherein the capacitor remains at a substantially zero potential during normal operation and the capacitor is discharged during the normal operation and is only charged when a pulse is passing through the SEGR resistant delay cell; and
   a half-Schmitt trigger circuit having an input coupled to the output of the input section, and an output coupled to the delay output.

2. The delay cell of claim 1 wherein the input section comprises an inverting input section.

3. The delay cell of claim 1 wherein the input section comprises:

a P-channel transistor having a source coupled to VDD, a gate coupled to the input, and a drain coupled to the output;

a first N-channel transistor having a source, a gate coupled to the input, and a drain coupled to the output; and a second N-channel transistor having a source coupled to ground, a gate for receiving a bias voltage, and a drain coupled to the source of the first N-channel transistor.

4. The delay cell of claim 3 wherein the bias voltage comprises a diode-generated bias voltage.

5. The delay cell of claim 3 wherein the bias voltage is provided by a bias circuit comprising:

a P-channel transistor having a source coupled to VDD, a gate for receiving a control voltage, and a drain; and a diode-connected N-channel transistor coupled between the drain of the P-channel transistor and ground for providing a bias voltage.

6. The delay cell of claim 1 wherein the capacitor comprises a capacitor-connected transistor.

7. The delay cell of claim 6 wherein the transistor comprises an N-channel transistor.

8. The delay cell of claim 1 wherein the half-Schmitt trigger circuit comprises:

a first P-channel transistor having a source coupled to VDD, a gate coupled to the input, and a drain;

a second P-channel transistor having a source coupled to the drain of the first P-channel transistor, a gate coupled to the input, and a drain coupled to the output;

a third P-channel transistor having a current path coupled between drain of the first P-channel transistor and ground, and a gate coupled to the output; and an N-channel transistor having a drain coupled to the output, a gate coupled to the input, and a source coupled to ground.

9. An SET and SEGR resistant delay line configured to be substantially immune to radiation effects, comprising a plurality of serially-coupled delay cells, each delay cell comprising:

a delay input and a delay output;

a one-sided current starved input section having an input coupled to the delay input, and an output;

a capacitor coupled between the output of the input section and ground, wherein the capacitor remains at a substantially zero potential during normal operation and the capacitor is discharged during the normal operation and is only charged when a pulse is passing through the SEGR resistant delay cell; and a half-Schmitt trigger circuit having an input coupled to the output of the input section, and an output coupled to the delay output.

10. The delay cell of claim 9 wherein the input section of at least one delay element comprises an inverting input section.

11. The delay cell of claim 9 wherein the input section of at least one delay element comprises:

a P-channel transistor having a source coupled to VDD, a gate coupled to the input, and a drain coupled to the output;

a first N-channel transistor having a source, a gate coupled to the input, and a drain coupled to the output; and a second N-channel transistor having a source coupled to ground, a gate for receiving a bias voltage, and a drain coupled to the source of the first N-channel transistor.

12. The delay cell of claim 11 wherein the bias voltage comprises a diode-generated bias voltage.

13. The delay cell of claim 11 wherein the bias voltage is provided by a bias circuit comprising:

a P-channel transistor having a source coupled to VDD, a gate for receiving a control voltage, and a drain; and a diode-connected N-channel transistor coupled between the drain of the P-channel transistor and ground for providing a controlled bias voltage.

14. The delay cell of claim 9 wherein the capacitor of at least one delay element comprises a capacitor-connected transistor.

15. The delay cell of claim 14 wherein the transistor comprises an N-channel transistor.

16. The delay cell of claim 9 wherein the half-Schmitt trigger circuit comprises:

a first P-channel transistor having a source coupled to VDD, a gate coupled to the input, and a drain;

a second P-channel transistor having a source coupled to the drain of the first P-channel transistor, a gate coupled to the input, and a drain coupled to the output;

a third P-channel transistor having a current path coupled between drain of the first P-channel transistor and ground, and a gate coupled to the output; and an N-channel transistor having a drain coupled to the output, a gate coupled to the input, and a source coupled to ground.

17. The delay cell of claim 9 further comprising an output section.

18. The delay cell of claim 17 wherein the output section comprises:

a first input for receiving an input signal;

a second input coupled to the output of a last delay element; and an output.

19. A method of operating an SET and SEGR resistant delay cell configured to be substantially immune to radiation effects, comprising the steps of:

providing a delay input and a delay output;

providing a one-sided current starved input section having an input coupled to the delay input, and an output;

providing a capacitor coupled between the output of the input section and ground;

providing a half-Schmitt trigger circuit having an input coupled to the output of the input section, and an output coupled to the delay output;

discharging the capacitor during the normal operation such that the capacitor remains at a substantially zero potential during the normal operation; and charging the capacitor when a pulse passes through the SEGR resistant delay cell.

20. The method of claim 19 wherein the providing the input section comprises providing an inverting input section.

21. The method of claim 19 wherein the providing the input section further comprises:

providing a P-channel transistor having a source coupled to VDD, a gate coupled to the input, and a drain coupled to the output;

providing a first N-channel transistor having a source, a gate coupled to the input, and a drain coupled to the output; and providing a second N-channel transistor having a source coupled to ground, a gate for receiving a bias voltage, and a drain coupled to the source of the first N-channel transistor.

22. The method of claim 21 wherein the bias voltage comprises a diode-generated bias voltage.

23. The method of claim 21 wherein the bias voltage is provided by a bias circuit further comprising the steps of:

providing a P-channel transistor having a source coupled to VDD, a gate for receiving a control voltage, and a drain; and providing a diode-connected N-channel transistor coupled between the drain of the P-channel transistor and ground for providing a bias voltage.

24. The method of claim 19 wherein the capacitor comprises a capacitor-connected transistor.

25. The method of claim 24 wherein the transistor comprises an N-channel transistor.

26. The method of claim 19 wherein providing the half-Schmitt trigger circuit comprises the steps of:

providing a first P-channel transistor having a source coupled to VDD, a gate coupled to the input, and a drain;

providing a second P-channel transistor having a source coupled to the drain of the first P-channel transistor, a gate coupled to the input, and a drain coupled to the output;

providing a third P-channel transistor having a current path coupled between the drain of the first P-channel transistor and ground, and a gate coupled to the output; and providing an N-channel transistor having a drain coupled to the output, a gate coupled to the input, and a source coupled to ground.

* * * * *